(12) United States Patent
Chen et al.

(10) Patent No.: US 11,735,266 B2
(45) Date of Patent: Aug. 22, 2023

(54) ANTIFUSE-TYPE ONE TIME PROGRAMMING MEMORY CELL AND CELL ARRAY STRUCTURE WITH SAME

(71) Applicant: eMemory Technology Inc., Hsin-Chu (TW)

(72) Inventors: Lun-Chun Chen, Hsinchu County (TW); Jiun-Ren Chen, Hsinchu County (TW); Ping-Lung Ho, Hsinchu County (TW); Hsin-Ming Chen, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 136 days.

(21) Appl. No.: 17/536,414

(22) Filed: Nov. 29, 2021

(65) Prior Publication Data
US 2023/0049378 A1  Feb. 16, 2023

Related U.S. Application Data

(60) Provisional application No. 63/232,668, filed on Aug. 13, 2021.

(51) Int. Cl.
*G11C 16/26* (2006.01)
*G11C 16/10* (2006.01)
(Continued)

(52) U.S. Cl.
CPC ........ *G11C 16/102* (2013.01); *G11C 16/0433* (2013.01); *G11C 16/24* (2013.01);
(Continued)

(58) Field of Classification Search
CPC ... G11C 16/102; G11C 16/0433; G11C 16/24; G11C 16/26; G11C 16/30; G11C 17/08; G11C 17/16
See application file for complete search history.

(56) References Cited

U.S. PATENT DOCUMENTS

2005/0007855 A1  1/2005  Lee
2006/0291267 A1  12/2006  Jenne et al.
(Continued)

FOREIGN PATENT DOCUMENTS

TW   457687 B      10/2001
TW   202042223 A   11/2020
UA   105003 C2     4/2014

OTHER PUBLICATIONS

Japan Patent Office "Notification of Reasons for Refusal" dated Feb. 14, 2023, JPO.
(Continued)

*Primary Examiner* — Xiaochun L Chen
(74) *Attorney, Agent, or Firm* — WPAT, P.C (57) ABSTRACT

An antifuse-type one time programming memory cell includes a select device, a following device and an antifuse transistor. A first terminal of the select device is connected with a bit line. A second terminal of the select device is connected with a first node. A select terminal of the select device is connected with a word line. A first terminal of the following device is connected with the first node. A second terminal of the following device is connected with a second node. A control terminal of the following device is connected with a following control line. A first drain/source terminal of the antifuse transistor is connected with the second node. A gate terminal of the antifuse transistor is connected with an antifuse control line. A second drain/source terminal of the antifuse transistor is in a floating state.

18 Claims, 7 Drawing Sheets

(51) Int. Cl.
*G11C 16/04* (2006.01)
*G11C 16/24* (2006.01)
*G11C 16/30* (2006.01)
*G11C 17/08* (2006.01)

(52) U.S. Cl.
CPC .............. *G11C 16/26* (2013.01); *G11C 16/30* (2013.01); *G11C 17/08* (2013.01)

(56) References Cited

U.S. PATENT DOCUMENTS

| | | | | |
|---|---|---|---|---|
| 2006/0291316 A1* | 12/2006 | Jenne | ..................... | G11C 17/18 365/225.7 |
| 2014/0340955 A1* | 11/2014 | Wu | ......................... | G11C 17/16 365/104 |
| 2017/0117284 A1 | 4/2017 | Wu et al. | | |

OTHER PUBLICATIONS

Search report issued by EPO dated Aug. 3, 2022.
Office Action issued by TIPO dated Nov. 21, 2022.

* cited by examiner

ANTIFUSE-TYPE ONE TIME PROGRAMMING MEMORY CELL AND CELL ARRAY STRUCTURE WITH SAME

This application claims the benefit of U.S. provisional application Ser. No. 63/232,668, filed Aug. 13, 2021, the subject matter of which is incorporated herein by reference.

FIELD OF THE INVENTION

The present invention relates to a non-volatile memory cell, and more particularly to an antifuse-type one time programming memory cell and an associated cell array structure.

BACKGROUND OF THE INVENTION

As is well known, a non-volatile memory is able to continuously retain data after the supplied power is interrupted. Generally, after the non-volatile memory leaves the factory, the user may program the non-volatile memory in order to record data into the non-volatile memory.

According to the number of times the non-volatile memory is programmed, the non-volatile memories may be classified into a multi-time programming memory (also referred as a MTP memory), a one time programming memory (also referred as an OTP memory) and a mask read only memory (also referred as a Mask ROM).

Generally, the MTP memory can be programmed many times, and the stored data of the MTP memory can be modified many times. On the contrary, the OTP memory can be programmed once. After the OTP memory is programmed, the stored data fails to be modified. Moreover, after the Mask ROM leaves the factory, all stored data have been recorded therein. The user is only able to read the stored data from the Mask ROM, but is unable to program the Mask ROM.

Moreover, depending on the characteristics, the OTP memories may be classified into two types, i.e., a fuse-type OTP memory and an antifuse-type OTP memory. Before a memory cell of the fuse-type OTP memory is programmed, the memory cell has a low-resistance storage state. After the memory cell of the fuse-type OTP memory is programmed, the memory cell has a high-resistance storage state.

On the other hand, the memory cell of the antifuse-type OTP memory has the high-resistance storage state before programmed, and the memory cell of the antifuse-type OTP memory has the low-resistance storage state after programmed.

Figure 1A:
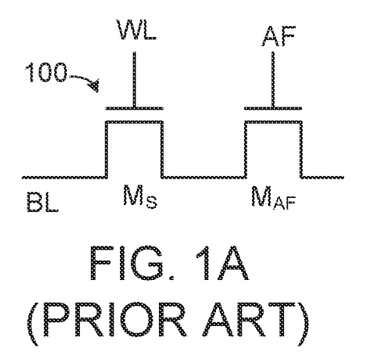
FIG. 1A (prior art) is a schematic circuit diagram illustrating a conventional antifuse-type OTP memory cell as shown in FIG. 1A.

FIG. 1A is a schematic circuit diagram illustrating a conventional antifuse-type OTP memory cell. As shown in FIG. 1A, the antifuse-type OTP memory cell 100 comprises a select transistor $M_S$ and an antifuse transistor $M_{AF}$. The first drain/source terminal of the select transistor $M_S$ is connected with a bit line BL. The gate terminal of the select transistor $M_S$ is connected with a word line WL. The second drain/source terminal of the select transistor $M_S$ is connected with the first drain/source terminal of the antifuse transistor $M_{AF}$. The gate terminal of the antifuse transistor $M_{AF}$ is connected with an antifuse control line AF. The second drain/source terminal of the antifuse transistor $M_{AF}$ is in a floating state.

Since the second drain/source terminal of the antifuse transistor $M_{AF}$ is in the floating state, the antifuse transistor $M_{AF}$ can be considered as a capacitor. Moreover, since the antifuse-type OTP memory cell 100 includes one transistor and one capacitor, the antifuse-type OTP memory cell 100 can be referred as a 1T1C cell.

Figure 1B:
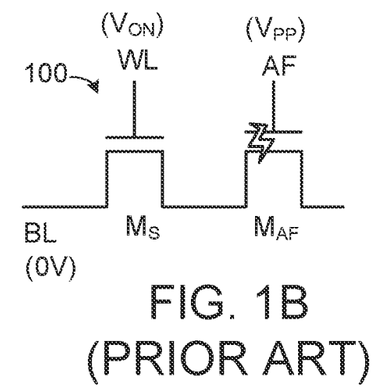
FIG. 1B (prior art) schematically illustrates associated bias voltages for performing a program action on the conventional antifuse-type OTP memory cell as shown in FIG. 1A.
Figure 1C:
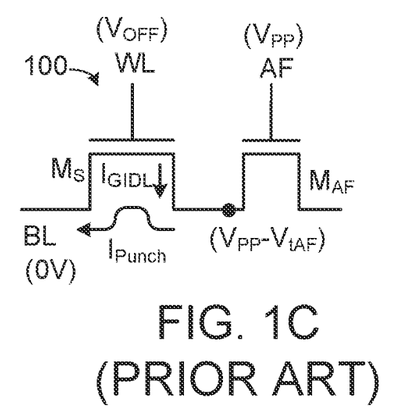
FIG. 1C (prior art) schematically illustrates associated bias voltages for performing a program inhibition action on the conventional antifuse-type OTP memory cell.

FIG. 1B schematically illustrates associated bias voltages for performing a program action on the conventional antifuse-type OTP memory cell as shown in FIG. 1A. FIG. 10 schematically illustrates associated bias voltages for performing a program inhibition action on the conventional antifuse-type OTP memory cell as shown in FIG. 1A.

Please refer to FIG. 1B. When the program action is performed, the bit line BL receives a ground voltage (0V), the antifuse control line AF receives a program voltage $V_{PP}$, and the word line WL receives an on voltage $V_{ON}$. For example, the program voltage $V_{PP}$ is 5V, and the on voltage $V_{ON}$ is 2.5V.

When the program action is performed, the select transistor $M_S$ is turned on, and the ground voltage (0V) of the bit line BL is transferred to the first drain/source terminal of the antifuse transistor $M_{AF}$. Consequently, the voltage stress between the gate terminal and the first drain/source terminal of the antifuse transistor $M_{AF}$ is equal to the program voltage $V_{PP}$. Under this circumstance, a gate oxide layer of the antifuse transistor $M_{AF}$ is ruptured, and the region between the gate terminal and the first drain/source terminal of the antifuse transistor $M_{AF}$ has a low resistance value. That is, the antifuse-type OTP memory cell 100 is in a low-resistance storage state.

Please refer to FIG. 1C. When the program inhibition action is performed, the bit line BL receives the ground voltage (0V), the antifuse control line AF receives the program voltage $V_{PP}$, and the word line WL receives an off voltage $V_{OFF}$. For example, the off voltage $V_{OFF}$ is 0V.

When the program inhibition action is performed, the select transistor $M_S$ is turned off, and the ground voltage (0V) of the bit line BL cannot be transferred to the first drain/source terminal of the antifuse transistor $M_{AF}$. Consequently, the voltage stress between the gate terminal and the first drain/source terminal of the antifuse transistor $M_{AF}$ is very low. Under this circumstance, the gate oxide layer of the antifuse transistor $M_{AF}$ is not ruptured, and the region between the gate terminal and the first drain/source terminal of the antifuse transistor $M_{AF}$ is maintained at a high resistance value. That is, the antifuse-type OTP memory cell 100 is in a high-resistance storage state.

Please refer to FIG. 1C again. When the program inhibition action is performed, the select transistor $M_S$ is turned off. Meanwhile, the select transistor $M_S$ generates a leakage current. For example, the leakage current includes a punch current $I_{Punch}$ and a gate induced drain leakage (GIDL) current $I_{GIDL}$.

When the select transistor $M_S$ is turned off, the voltage at the second drain/source terminal of the select transistor $M_S$ is approximately equal to $(V_{PP}-V_{tAF})$, wherein $V_{tAF}$ is a threshold voltage of the antifuse transistor $M_{AF}$ (e.g., about 1V). In other words, the voltage at the second drain/source terminal of the select transistor $M_S$ is about 4V (i.e., 5V−1V=4V).

Moreover, when the select transistor $M_S$ is turned off, the voltage difference between the first drain/source terminal and the second drain/source terminal of the select transistor $M_S$ may result in the generation of the punch current $I_{Punch}$. As the voltage difference increases, the magnitude of the punch current $I_{Punch}$ increases. For example, as shown in FIG. 10, the voltage difference between the first drain/source terminal and the second drain/source terminal of the select transistor $M_S$ is about 4V. Consequently, the magnitude of the punch current $I_{Punch}$ is high. The punch current $I_{Punch}$ flows in the direction from the second drain/source terminal of the select transistor $M_S$ to the first drain/source terminal of the select transistor $M_S$.

Moreover, when the select transistor $M_S$ is turned off, the voltage difference between the second drain/source terminal and the gate terminal of the select transistor $M_S$ may result in the generation of the GIDL current $I_{GIDL}$. As the voltage difference increases, the magnitude of the GIDL current $I_{GIDL}$ increases. For example, as shown in FIG. 10, the voltage difference between the first drain/source terminal and the second drain/source terminal of the select transistor $M_S$ is about 4V. Consequently, the magnitude of the GIDL current $I_{GIDL}$ is high. The GIDL current $I_{GIDL}$ flows in the direction from the second drain/source terminal of the select transistor $M_S$ to a body terminal of the select transistor $M_S$.

Figure 2A:
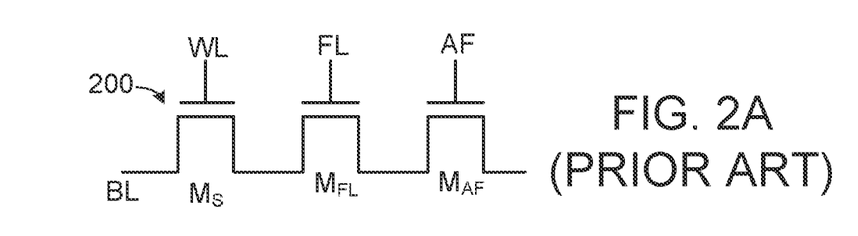
FIG. 2A (prior art) is a schematic circuit diagram illustrating another conventional antifuse-type OTP memory cell.

FIG. 2A is a schematic circuit diagram illustrating another conventional antifuse-type OTP memory cell. As shown in FIG. 2A, the antifuse-type OTP memory cell 200 comprises a select transistor $M_S$, a following transistor $M_{FL}$ and an antifuse transistor $M_{AF}$. The first drain/source terminal of the select transistor $M_S$ is connected with a bit line BL. The gate terminal of the select transistor $M_S$ is connected with a word line WL. The second drain/source terminal of the select transistor $M_S$ is connected with the first drain/source terminal of the following transistor $M_{FL}$. The gate terminal of the following transistor $M_{FL}$ is connected with a following control line FL. The second drain/source terminal of the following transistor $M_{FL}$ is connected with the first drain/source terminal of the antifuse transistor $M_{AF}$. The gate terminal of the antifuse transistor $M_{AF}$ is connected with an antifuse control line AF. The second drain/source terminal of the antifuse transistor $M_{AF}$ is in a floating state.

Since the second drain/source terminal of the antifuse transistor $M_{AF}$ is in the floating state, the antifuse transistor $M_{AF}$ can be considered as a capacitor. Moreover, since the antifuse-type OTP memory cell 200 includes two transistors and one capacitor, the antifuse-type OTP memory cell 200 can be referred as a 2T1C cell.

Figure 2B:
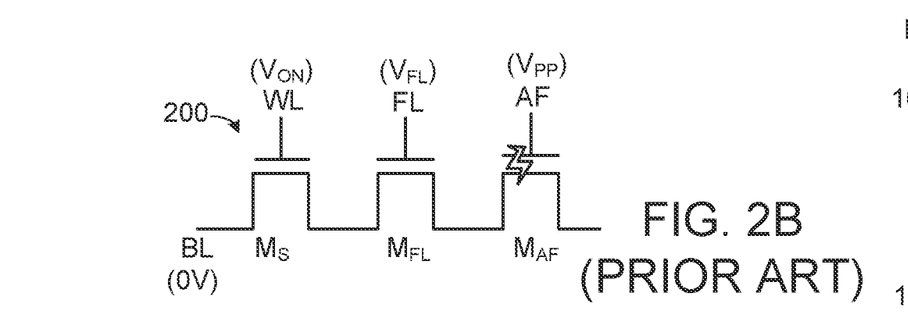
FIG. 2B (prior art) schematically illustrates associated bias voltages for performing a program action on the conventional antifuse-type OTP memory cell as shown in FIG. 2A.
Figure 2C:
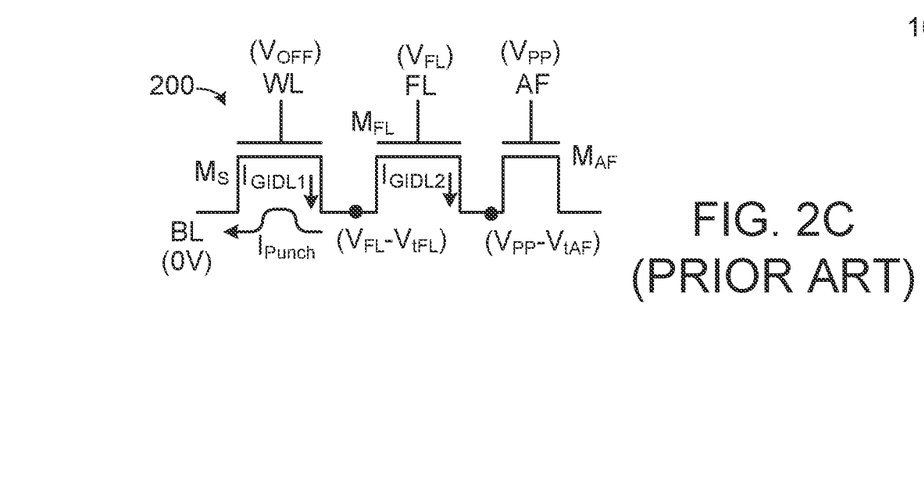
FIG. 2C (prior art) schematically illustrates associated bias voltages for performing a program inhibition action on the conventional antifuse-type OTP memory cell as shown in FIG. 2A.

FIG. 2B schematically illustrates associated bias voltages for performing a program action on the conventional antifuse-type OTP memory cell as shown in FIG. 2A. FIG. 2C schematically illustrates associated bias voltages for performing a program inhibition action on the conventional antifuse-type OTP memory cell as shown in FIG. 2A.

Please refer to FIG. 2B. When the program action is performed, the bit line BL receives a ground voltage (0V), the antifuse control line AF receives a program voltage $V_{PP}$, the word line WL receives an on voltage $V_{ON}$, and the following control line FL receives a control voltage $V_{FL}$. For example, the program voltage $V_{PP}$ is 5V, the on voltage $V_{ON}$ is 1.8V, and the control voltage $V_{FL}$ is 1.8V. In response to the control voltage $V_{FL}$, the following transistor $M_{FL}$ is controlled to be in a conducting state.

When the select transistor $M_S$ is turned on and the following transistor $M_{FL}$ is in the conducting state, the ground voltage (0V) of the bit line BL is transferred to the first drain/source terminal of the antifuse transistor $M_{AF}$. Consequently, the voltage stress between the gate terminal and the first drain/source terminal of the antifuse transistor $M_{AF}$ is equal to the program voltage $V_{PP}$. Under this circumstance, a gate oxide layer of the antifuse transistor $M_{AF}$ is ruptured, and the region between the gate terminal and the first drain/source terminal of the antifuse transistor $M_{AF}$ has a low resistance value. That is, the antifuse-type OTP memory cell 200 is in a low-resistance storage state.

Please refer to FIG. 2C. When the program inhibition action is performed, the bit line BL receives the ground voltage (0V), the antifuse control line AF receives the program voltage $V_{PP}$, the word line WL receives an off voltage $V_{OFF}$, and the following control line FL receives a control voltage $V_{FL}$. For example, the off voltage $V_{OFF}$ is 0V.

Consequently, when the select transistor $M_S$ is turned off and the following transistor MFS is in the conducting state, the ground voltage (0V) of the bit line BL cannot be transferred to the first drain/source terminal of the antifuse transistor $M_{AF}$. Consequently, the voltage stress between the gate terminal and the first drain/source terminal of the antifuse transistor $M_{AF}$ is very low. Under this circumstance, the gate oxide layer of the antifuse transistor $M_{AF}$ is not ruptured, and the region between the gate terminal and the first drain/source terminal of the antifuse transistor $M_{AF}$ is maintained at a high resistance value. That is, the antifuse-type OTP memory cell 200 is in a high-resistance storage state.

Please refer to FIG. 2C again. When the program inhibition action is performed, the select transistor $M_S$ is turned off. Meanwhile, the voltage at the second drain/source terminal of the select transistor $M_S$ is approximately equal to $(V_{FL}-V_{tFL})$, and the select transistor $M_S$ generates a leakage current. For example, the leakage current includes a punch current $I_{Punch}$ and a gate induced drain leakage (GIDL) current $I_{GIDL1}$. In addition, the voltage at the second drain/source terminal of the antifuse transistor $M_{AF}$ is approximately equal to $(V_{PP}-V_{tAF})$, and the antifuse transistor $M_{AF}$ generates a leakage current, e.g., a gate induced drain leakage (GIDL) current $I_{GIDL2}$. For example, $V_{tFL}$ is a threshold voltage of the following transistor $M_{FL}$ (e.g., about 1V), and $V_{tAF}$ is a threshold voltage of the antifuse transistor $M_{AF}$ (e.g., about 0.7V). In other words, the voltage at the second drain/source terminal of the select transistor $M_S$ is about 1.1V (i.e., 1.8V−0.7V=1.1V), and the voltage at the second drain/source terminal of the following transistor $M_{FL}$ is about 4V (i.e., 5V−1V=4V).

Moreover, the voltage difference between the second drain/source terminal and the first drain/source terminal of the select transistor $M_S$ (e.g., 1.1V) may result in the generation of the punch current $I_{Punch}$, and the voltage difference between the second drain/source terminal and the gate terminal of the select transistor $M_S$ (e.g., 1.1V) may result in the generation of the GIDL current $I_{GIDL1}$. The voltage difference between the second drain/source terminal and the gate terminal of the following transistor $M_{FL}$ is 2.2V (i.e., 4V−1.8V=2.2V), and this voltage difference may result in the generation of the GIDL current $I_{GIDL2}$.

Figure 2D:
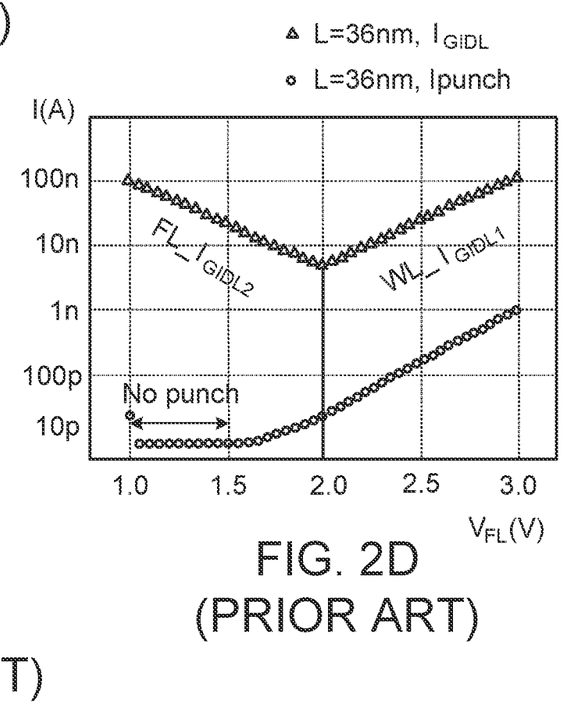
FIG. 2D (prior art) is a plot illustrating the relationship between the control voltage and the leakage current when the conventional antifuse-type OTP memory cell undergoes a program inhibition action.

Generally, by adjusting the control voltage $V_{FL}$, the magnitude of the leakage current of the conventional antifuse-type OTP memory cell 200 can be further adjusted. FIG. 2D is a plot illustrating the relationship between the control voltage $V_{FL}$ and the leakage current when the conventional antifuse-type OTP memory cell undergoes a program inhibition action. For example, the channel length of each of the select transistor $M_S$, the following transistor $M_{FL}$ and the antifuse transistor $M_{AF}$ in the antifuse-type OTP memory cell 200 is 36 nm.

Please refer to FIG. 2D. As the control voltage $V_{FL}$ decreases, the punch current $I_{Punch}$ and the GIDL current $I_{GIDL1}$ generated by the select transistor $M_S$ decrease, but the GIDL current $I_{GIDL2}$ generated by the following transistor $M_{FL}$ increases. Whereas, as the control voltage $V_{FL}$ increases, the GIDL current $I_{GIDL2}$ generated by the following transistor $M_{FL}$ decreases, but the punch current $I_{Punch}$ and the GIDL current $I_{GIDL1}$ generated by the select transistor $M_S$ increase.

As shown in FIG. 2D, the magnitude of the total leakage current generated by the antifuse-type OTP memory cell 200 is low when the control voltage $V_{FL}$ is adjusted to 2.0V. Under this circumstance, the punch current $I_{Punch}$ generated by the select transistor $M_S$ is about 50 pA, the GIDL current $I_{GIDL1}$ generated by the select transistor $M_S$ is about 7 nA, and the GIDL current $I_{GIDL2}$ generated by the following transistor $M_{FL}$ is about 7 nA.

With increasing advance of the semiconductor manufacturing process, the size of the transistor becomes smaller and smaller, and the leakage current abruptly increases. For example, in case that the channel length of the transistor in the antifuse-type OTP memory cell 200 is smaller than 16 nm, the problem of generating the leakage current becomes more serious.

SUMMARY OF THE INVENTION

An embodiment of the present invention provides a cell array structure. The cell array structure includes a first antifuse-type one time programming memory cell. The first antifuse-type one time programming memory cell includes a first select device, a first following device and a first antifuse transistor. A first terminal of the first select device is connected with a first bit line. A second terminal of the first select device is connected with a first node. A select terminal of the first select device is connected with a first word line. A first terminal of the first following device is connected with the first node. A second terminal of the first following device is connected with a second node. A first control terminal of the first following device is connected with a first following control line. A first drain/source terminal of the first antifuse transistor is connected with the second node. A gate terminal of the first antifuse transistor is connected with a first antifuse control line. A second drain/source terminal of the first antifuse transistor is in a floating state. The first select device includes a first select transistor and a second select transistor. A first drain/source terminal of the first select transistor is connected with the first bit line. A gate terminal of the first select transistor is connected with the first word line. A second drain/source terminal of the first select transistor is connected with a first drain/source terminal of the second select transistor. A gate terminal of the second select transistor is connected with the first word line. A second drain/source terminal of the second select transistor is connected with the first node.

Another embodiment of the present invention provides a cell array structure. The cell array structure includes a first antifuse-type one time programming memory cell. The first antifuse-type one time programming memory cell includes a first select device, a first following device and a first antifuse transistor. A first terminal of the first select device is connected with a first bit line. A second terminal of the first select device is connected with a first node. A select terminal of the first select device is connected with a first word line. A first terminal of the first following device is connected with the first node. A second terminal of the first following device is connected with a second node. A first control terminal of the first following device is connected with a first following control line. A second control terminal of the first following device is connected with a second following control line. A first drain/source terminal of the first antifuse transistor is connected with the second node. A gate terminal of the first antifuse transistor is connected with a first antifuse control line. A second drain/source terminal of the first antifuse transistor is in a floating state. The first following device comprises a first following transistor and a second following transistor. A first drain/source terminal of the first following transistor is connected with the first node. A gate terminal of the first following transistor is connected with the first following control line. A second drain/source terminal of the first following transistor is connected with a first drain/source terminal of the second following transistor. A gate terminal of the second following transistor is connected with the second following control line. A second drain/source terminal of the second following transistor is connected with the second node.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 3A:
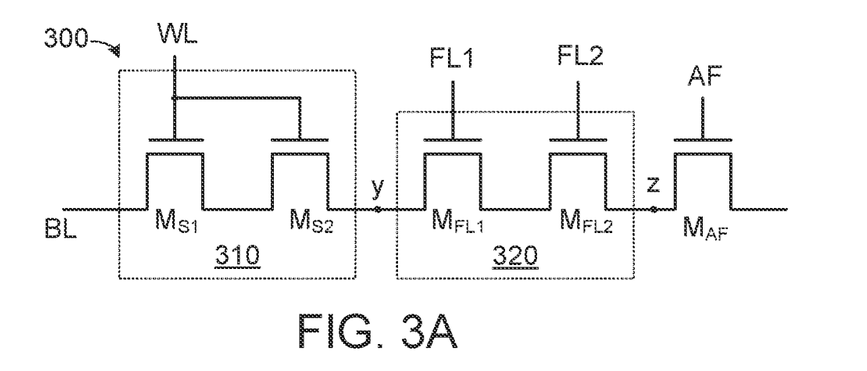
FIG. 3A is a schematic circuit diagram illustrating an antifuse-type OTP memory cell according to a first embodiment of the present invention.

FIG. 3A is a schematic circuit diagram illustrating an antifuse-type OTP memory cell according to a first embodiment of the present invention. As shown in FIG. 3A, the antifuse-type OTP memory cell 300 comprises a select device 310, a following device 320 and an antifuse transistor $M_{AF}$.

The connection relationships between associated components of the antifuse-type OTP memory cell 300 will be described as follows. The first terminal of the select device 310 is connected with a bit line BL. The select terminal of the select device 310 is connected with a word line WL. The second terminal of the select device 310 is connected with the node y. The first terminal of the following device 320 is connected with the node y. The plural control terminals of the following device 320 are connected with corresponding following control lines. For succinctness, only two following control lines FL1 and FL2 are shown. The second terminal of the following device 320 is connected with the node z. The first drain/source terminal of the antifuse transistor $M_{AF}$ is connected with the node z. The gate terminal of the antifuse transistor $M_{AF}$ is connected with an antifuse control line AF. The second drain/source terminal of the antifuse transistor $M_{AF}$ is in a floating state.

In this embodiment, the select device 310 comprises two select transistors $M_{S1}$ and $M_{S2}$, and the following device 320 comprises two following transistors $M_{FL1}$ and $M_{FL2}$. The connection relationships between associated components of the select device 310 will be described as follows. The first drain/source terminal of the select transistor $M_{S1}$ is connected with the bit line BL. The gate terminal of the select transistor $M_{S1}$ is connected with the word line WL. The second drain/source terminal of the select transistor $M_{S1}$ is connected with the first drain/source terminal of the select transistor $M_{S2}$. The gate terminal of the select transistor $M_{S2}$ is connected with the word line WL. The second drain/source terminal of the select transistor $M_{S2}$ is connected with the node y. The connection relationships between associated components of the following device 320 will be described as follows. The first drain/source terminal of the following transistor $M_{FL1}$ is connected with the node y. The gate terminal of the following transistor $M_{FL1}$ is connected with the following control line FL1. The second drain/source terminal of the following transistor $M_{FL1}$ is connected with the first drain/source terminal of the following transistor $M_{FL2}$. The gate terminal of the following transistor $M_{FL2}$ is connected with the following control line FL2. The second drain/source terminal of the following transistor $M_{FL2}$ is connected with the node z.

Since the second drain/source terminal of the antifuse transistor $M_{AF}$ is in the floating state, the antifuse transistor $M_{AF}$ can be considered as a capacitor. Moreover, since the antifuse-type OTP memory cell 300 includes four transistors and one capacitor, the antifuse-type OTP memory cell 300 can be referred as a 4T1C cell. A program action or a program inhibition action can be selectively performed on the antifuse-type OTP memory cell 300. The two select transistors $M_{S1}$ and $M_{S2}$ are to be turned on or turned off according to the program action or the program inhibition action is performed. The two following transistors $M_{FL1}$ and $M_{FL2}$ are to be turned on in a conducting state always in the program action and the program inhibition action. The bias voltages for performing the program action or a program inhibition will be described as follows. In one embodiment, the channel length of the transistors in the antifuse-type OTP memory cell 300 is 16 nm.

Figure 3B:
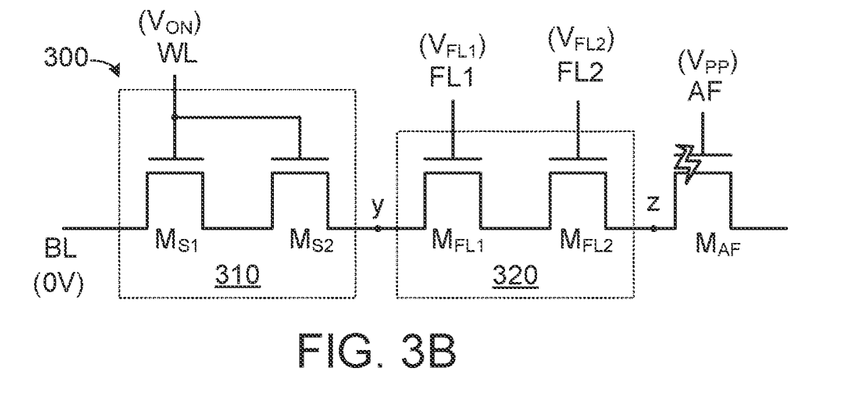
FIG. 3B schematically illustrates associated bias voltages for performing a program action on the antifuse-type OTP memory cell as shown in FIG. 3A.
Figure 3C:
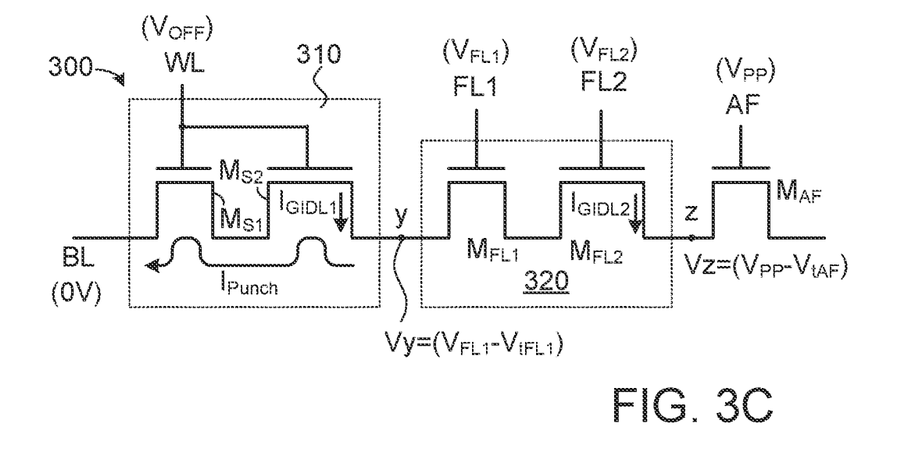
FIG. 3C schematically illustrates associated bias voltages for performing a program inhibition action on the antifuse-type OTP memory cell as shown in FIG. 3A.

FIG. 3B schematically illustrates associated bias voltages for performing a program action on the conventional antifuse-type OTP memory cell in the first embodiment as shown in FIG. 3A. FIG. 3C schematically illustrates associated bias voltages for performing a program inhibition action on the conventional antifuse-type OTP memory cell in the first embodiment as shown in FIG. 3A.

Please refer to FIG. 3B. When the program action is performed, the bit line BL receives a ground voltage (0V), the antifuse control line AF receives a program voltage $V_{PP}$, the word line WL receives an on voltage $V_{ON}$, the following control line FL1 receives a first control voltage $V_{FL1}$, and the following control line FL2 receives a second control voltage $V_{FL2}$. For example, the program voltage $V_{PP}$ is 5V, the on voltage $V_{ON}$ is 1V, the first control voltage $V_{FL1}$ is 1.5V, and the second control voltage $V_{FL2}$ is 2V. In response to the on voltage $V_{ON}$, the two select transistors $M_{S1}$ and $M_{S2}$ can be turned on. That is, in response to the on voltage $V_{ON}$, the select device 310 can be turned on. In response to the two control voltages $V_{FL1}$ and $V_{FL2}$, the following transistors $M_{FL1}$ and $M_{FL2}$ are controlled to be in a conducting state, respectively. That is, the following device 320 is in the conducting state. Consequently, the region between the node y and the node z is conducted. In this embodiment, the program voltage $V_{PP}$ is higher than the second control voltage $V_{FL2}$, the second control voltage $V_{FL2}$ is higher than or equal to the first control voltage $V_{FL1}$, and the first control voltage $V_{FL1}$ is higher than the on voltage $V_{ON}$.

When the select device 310 is turned on and the following device 320 is in the conducting state, the ground voltage (0V) of the bit line BL is transferred to the first drain/source terminal of the antifuse transistor $M_{AF}$. Consequently, the voltage stress between the gate terminal and the first drain/source terminal of the antifuse transistor $M_{AF}$ is equal to the program voltage $V_{PP}$. Under this circumstance, a gate oxide layer of the antifuse transistor $M_{AF}$ is ruptured, and the region between the gate terminal and the first drain/source terminal of the antifuse transistor $M_{AF}$ has a low resistance value. That is, the antifuse-type OTP memory cell 300 is in a low-resistance storage state.

Please refer to FIG. 3C. When the program inhibition action is performed, the bit line BL receives the ground voltage (0V), the antifuse control line AF receives the program voltage $V_{PP}$, the word line WL receives an off voltage $V_{OFF}$, the following control line FL1 receives the first control voltage $V_{FL1}$, and the following control line FL2 receives the second control voltage $V_{FL2}$. For example, the program voltage $V_{PP}$ is 5V, the off voltage $V_{OFF}$ is 0V, the first control voltage $V_{FL1}$ is 1.5V, and the second control voltage $V_{FL2}$ is 2V. In response to the off voltage $V_{OFF}$, the two select transistors $M_{S1}$ and $M_{S2}$ are turned off. That is, in response to the off voltage $V_{OFF}$, the select device 310 is turned off.

When the select device 310 is turned off and the following device 320 is in the conducting state (the two following transistors $M_{FL1}$ and $M_{FL2}$ are in the conducting state), the ground voltage (0V) of the bit line BL cannot be transferred to the first drain/source terminal of the antifuse transistor $M_{AF}$. Consequently, the voltage stress between the gate terminal and the first drain/source terminal of the antifuse transistor $M_{AF}$ is very low. Under this circumstance, the gate oxide layer of the antifuse transistor $M_{AF}$ is not ruptured, and the region between the gate terminal and the first drain/source terminal of the antifuse transistor $M_{AF}$ is maintained at a high resistance value. That is, the antifuse-type OTP memory cell 300 is in a high-resistance storage state.

Please refer to FIG. 3C again. When the program inhibition action is performed, the select device 310 is turned off. Meanwhile, the voltage at the node y is expressed as: $Vy=(V_{FL1}-V_{tFL1})$, and the select device 310 generates a leakage current. For example, the leakage current includes a punch current $I_{Punch}$ and a gate induced drain leakage (GIDL) current $I_{GIDL1}$. In addition, the voltage at the node z is expressed as: $Vz=(V_{PP}-V_{tAF})$, and the following transistor $M_{FL2}$ of the following device 320 generates a leakage current, e.g., a gate induced drain leakage (GIDL) current $I_{GIDL2}$. For example, $V_{tFL1}$ is a threshold voltage of the following transistor $M_{FL1}$ (e.g., about 0.7V), and $V_{tAF}$ is a threshold voltage of the antifuse transistor $M_{AF}$ (e.g., about 1V).

As mentioned above, by adjusting the magnitude of the first control voltage $V_{FL1}$, the voltage Vy at the node y can be further adjusted. Consequently, the punch current $I_{Punch}$ and the gate induced drain leakage current $I_{GIDL1}$ can be further adjusted. For example, in case that the first control voltage $V_{FL1}$ is 1.5V, the voltage Vy at the node y is about 0.8V (i.e., 1.5V−0.7V=0.8V). Under this circumstance, the select device 310 hardly generates the punch current $I_{Punch}$, and the gate induced drain leakage current $I_{GIDL1}$ is very low (e.g., about 1 nA).

Similarly, by adjusting the magnitude of the second control voltage $V_{FL2}$, the voltage difference between the second drain/source terminal of the following transistor $M_{FL2}$ (i.e., the node z) and the gate terminal of the following transistor $M_{FL2}$ can be further adjusted. Consequently, the gate induced drain leakage current $I_{GIDL2}$ is further adjusted. For example, in case that the second control voltage $V_{FL2}$ is 2V, the voltage Vz at the node z is about 4V (i.e., 5V−1V=4V), and the voltage difference between the second drain/source terminal of the following transistor $M_{FL2}$ and the gate terminal of the following transistor $M_{FL2}$ is about 2V (i.e., 4V−2V=2V). Under this circumstance, the gate induced drain leakage current $I_{GIDL2}$ is very low (e.g., about 3 nA).

In this embodiment, the select device 310 includes two select transistors $M_{S1}$ and $M_{S2}$. The serially-connected select transistors $M_{S1}$ and $M_{S2}$ can make the effective channel length of the selection device 310 increase, so that the punch current $I_{Punch}$ is reduced.

Furthermore, due to variations in the semiconductor manufacturing process, the select device 310 may receive an off voltage $V_{OFF}$ but cannot be completely turned off, resulting in an increase in leakage current. Since the select device 310 includes two serially-connected select transistors $M_{S1}$ and $M_{S2}$, as long as any one of the select transistors $M_{S1}$ and $M_{S2}$ receives the off voltage $V_{OFF}$ and is completely turned off, the select device 310 can be completely turned off to block the leakage current path. That is to ay, the leakage current of the antifuse-type OTP memory cell 300 can be reduced when the program inhibition action is performed.

In the first embodiment, each of the select device 310 and the following device 320 comprise two serially-connected transistors. It is noted that numerous modifications and alterations may be made while retaining the teachings of the invention. For example, in case that the channel length of the transistor is shorter, the select device 310 or the following device 320 may comprise at least two serially-connected transistors. For example, in a variant example of the antifuse-type OTP memory cell, the select device comprises three transistors, and the following device comprises two transistors. The three transistors of the select device are serially connected between the bit line BL and the node y. The two transistors of the following device are serially connected between the node y and the node z. Consequently, the antifuse-type OTP memory cell can be referred as a 5T1C cell. The gate terminals of the three transistors of the select device are connected with the word line. The gate terminals of the two transistors of the following device are connected with two different following control lines, respectively.

In another embodiment, the select device comprises two select transistors, and the following device comprises three following transistors. The two select transistors of the select device are serially connected between the bit line BL and the node y. The three following transistors of the following device are serially connected between the node y and the node z. Consequently, the antifuse-type OTP memory cell can be referred as a 5T1C cell. The gate terminals of the two transistors of the select device are connected with the word line. The gate terminals of the three transistors of the following device are connected with three different following control lines, respectively.

In another embodiment, the select device comprises three select transistors, and the following device comprises three following transistors. The three select transistors of the select device are serially connected between the bit line BL and the node y. The three following transistors of the following device are serially connected between the node y and the node z. Consequently, the antifuse-type OTP memory cell can be referred as a 6T1C cell. The gate terminals of the three transistors of the select device are connected with the word line. The gate terminals of the three transistors of the following device are connected with three different following control lines, respectively.

When the leakage current of the antifuse-type OTP memory cell is in the acceptable range, the antifuse-type OTP memory cell with a 3T1C cell configuration is also feasible. Some examples will be described as follows.

Figure 4A:
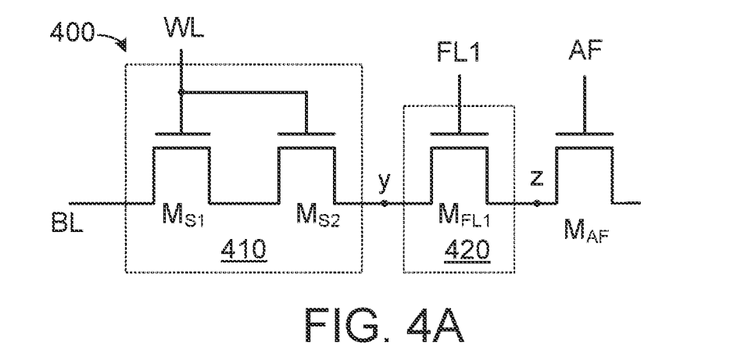
FIG. 4A is a schematic circuit diagram illustrating an antifuse-type OTP memory cell according to a second embodiment of the present invention.

FIG. 4A is a schematic circuit diagram illustrating an antifuse-type OTP memory cell according to a second embodiment of the present invention. As shown in FIG. 4A, the antifuse-type OTP memory cell 400 comprises a select device 410, a following device 420 and an antifuse transistor $M_{AF}$.

The connection relationships between associated components of the antifuse-type OTP memory cell 400 will be described as follows. The first terminal of the select device 410 is connected with a bit line BL. The select terminal of the select device 410 is connected with a word line WL. The second terminal of the select device 410 is connected with the node y. The first terminal of the following device 420 is connected with the node y. The control terminal of the following device 420 connected with corresponding following control line FL1. The second terminal of the following device 420 is connected with the node z. The first drain/source terminal of the antifuse transistor $M_{AF}$ is connected with the node z. The gate terminal of the antifuse transistor $M_{AF}$ is connected with an antifuse control line AF. The second drain/source terminal of the antifuse transistor $M_{AF}$ is in a floating state.

In this embodiment, the select device 410 comprises two select transistors $M_{S1}$ and $M_{S2}$, and the following device 420 comprises a following transistor $M_{FL1}$. The connection relationships between associated components of the select transistor 410 will be described as follows. The first drain/source terminal of the select transistor $M_{S1}$ is connected with the bit line BL. The gate terminal of the select transistor $M_{S1}$ is connected with the word line WL. The second drain/source terminal of the select transistor $M_{S1}$ is connected with the first drain/source terminal of the select transistor $M_{S2}$. The gate terminal of the select transistor $M_{S2}$ is connected with the word line WL. The second terminal of the select transistor $M_{S2}$ is connected with the node y. The connection relationships between associated components of the following device 420 will be described as follows. The first drain/source terminal of the following transistor $M_{FL1}$ is connected with the node y. The gate terminal of the following transistor $M_{FL1}$ is connected with the following control line FL1. The second drain/source terminal of the following transistor $M_{FL1}$ is connected with the node z.

Since the second drain/source terminal of the antifuse transistor $M_{AF}$ is in the floating state, the antifuse transistor $M_{AF}$ can be considered as a capacitor. Moreover, since the antifuse-type OTP memory cell 400 includes three transistors and one capacitor, the antifuse-type OTP memory cell 400 can be referred as a 3T1C cell.

Figure 4B:
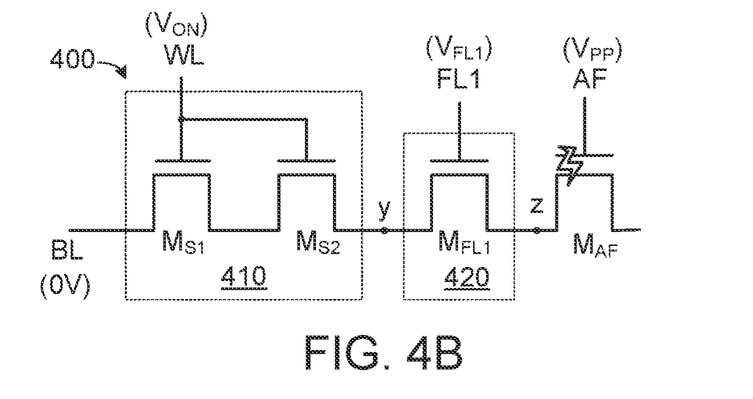
FIG. 4B schematically illustrates associated bias voltages for performing a program action on the antifuse-type OTP memory cell as shown in FIG. 4A.
Figure 4C:
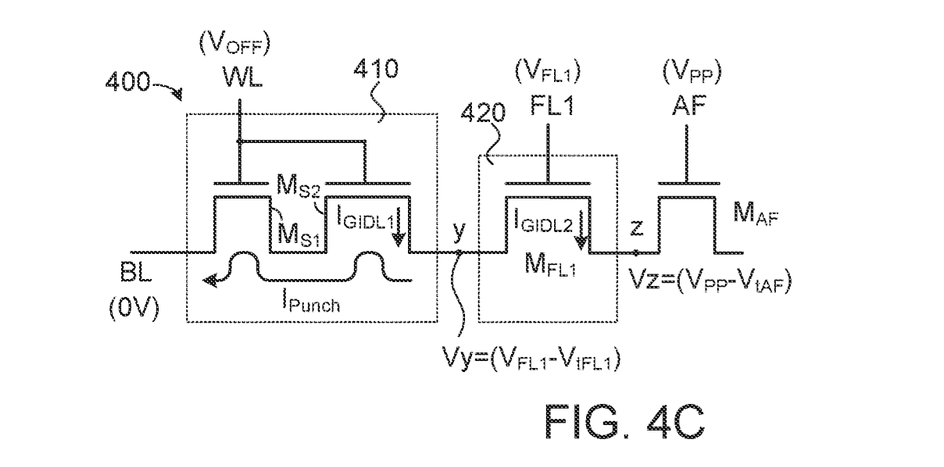
FIG. 4C schematically illustrates associated bias voltages for performing a program inhibition action on the antifuse-type OTP memory cell as shown in FIG. 4A.

FIG. 4B schematically illustrates associated bias voltages for performing a program action on the antifuse-type OTP memory cell as shown in FIG. 4A. FIG. 4C schematically illustrates associated bias voltages for performing a program inhibition action on the antifuse-type OTP memory cell as shown in FIG. 4A.

Please refer to FIG. 4B. When the program action is performed, the bit line BL receives a ground voltage (0V), the antifuse control line AF receives a program voltage $V_{PP}$, the word line WL receives an on voltage $V_{ON}$, and the following control line FL1 receives a first control voltage $V_{FL1}$. For example, the program voltage $V_{PP}$ is 5V, the on voltage $V_{ON}$ is 1.2V, and the first control voltage $V_{FL1}$ is 2V. In response to the on voltage $V_{ON}$, the two select transistors $M_{S1}$ and $M_{S2}$ are turned on. That is, in response to the on voltage $V_{ON}$, the select device 410 is turned on. In response to the first control voltage $V_{FL1}$, the following transistor $M_{FL1}$ is controlled to be in the conducting state. That is, the following device 420 is in the conducting state. Consequently, the region between the node y and the node z is conducted. In this embodiment, the program voltage $V_{PP}$ is higher than the first control voltage $V_{FL1}$, and the first control voltage $V_{FL1}$ is higher than the on voltage $V_{ON}$.

When the select device 410 is turned on and the following device 420 is in the conducting state, the ground voltage (0V) of the bit line BL is transferred to the first drain/source terminal of the antifuse transistor $M_{AF}$. Consequently, the voltage stress between the gate terminal and the first drain/source terminal of the antifuse transistor $M_{AF}$ is equal to the program voltage $V_{PP}$. Under this circumstance, a gate oxide layer of the antifuse transistor $M_{AF}$ is ruptured, and the region between the gate terminal and the first drain/source terminal of the antifuse transistor $M_{AF}$ has a low resistance value. That is, the antifuse-type OTP memory cell 400 is in a low-resistance storage state.

Please refer to FIG. 4C. When the program inhibition action is performed, the bit line BL receives the ground voltage (0V), the antifuse control line AF receives the program voltage $V_{PP}$, the word line WL receives an off voltage $V_{OFF}$, and the following control line FL1 receives the first control voltage $V_{FL1}$. For example, the program voltage $V_{PP}$ is 5V, the off voltage $V_{OFF}$ is 0V, and the first control voltage $V_{FL1}$ is 2V. In response to the off voltage $V_{OFF}$, the two select transistors $M_{S1}$ and $M_{S2}$ are turned off. That is, in response to the off voltage $V_{OFF}$, the select device 410 is turned off.

When the select device 410 is turned off and the following device 420 is in the conducting state, the ground voltage (0V) of the bit line BL cannot be transferred to the first drain/source terminal of the antifuse transistor $M_{AF}$. Consequently, the voltage stress between the gate terminal and the first drain/source terminal of the antifuse transistor $M_{AF}$ is very low. Under this circumstance, the gate oxide layer of the antifuse transistor $M_{AF}$ is not ruptured, and the region between the gate terminal and the first drain/source terminal of the antifuse transistor $M_{AF}$ is maintained at a high resistance value. That is, the antifuse-type OTP memory cell 400 is in a high-resistance storage state.

Please refer to FIG. 4C again. When the program inhibition action is performed, the select device 410 is turned off. Meanwhile, the voltage at the node y is expressed as: $Vy=(V_{FL1}-V_{tFL1})$, and the select device 410 generates a leakage current. For example, the leakage current includes a punch current $I_{Punch}$ and a gate induced drain leakage (GIDL) current $I_{GIDL1}$. In addition, the voltage at the node z is expressed as: $Vz=(V_{PP}-V_{tAF})$, and the following transistor $M_{FL2}$ of the following device 420 generates a leakage current, e.g., a gate induced drain leakage (GIDL) current $I_{GIDL2}$. For example, $V_{tFL1}$ is a threshold voltage of the following transistor $M_{FL1}$ (e.g., about 0.7V), and $V_{tAF}$ is a threshold voltage of the antifuse transistor $M_{AF}$ (e.g., about 1V).

As mentioned above, by adjusting the first control voltage $V_{FL1}$, the voltage Vy at the node y can be further adjusted. Consequently, the punch current $I_{Punch}$ and the gate induced drain leakage current $I_{GIDL1}$ are further adjusted. For example, in case that the first control voltage $V_{FL1}$ is 2V, the voltage Vy at the node y is about 1.3V (i.e., 2V−0.7V=1.3V). Under this circumstance, the punch current $I_{Punch}$ is about 50 pA, and the gate induced drain leakage current $I_{GIDL1}$ is about 7 nA.

Similarly, by adjusting the first control voltage $V_{FL1}$, the voltage difference between the second drain/source terminal of the following transistor $M_{FL1}$ (i.e., the node z) and the gate terminal of the following transistor $M_{FL1}$ can be further adjusted. Consequently, the gate induced drain leakage current $I_{GIDL2}$ is further adjusted. For example, in case that the first control voltage $V_{FL1}$ is 2V, the voltage Vz at the node z is about 4V (i.e., 5V−1V=4V), and the voltage difference between the second drain/source terminal of the following transistor $M_{FL1}$ and the gate terminal of the following transistor $M_{FL1}$ is about 2V (i.e., 4V−2V=2V). Under this circumstance, the gate induced drain leakage current $I_{GIDL2}$ is very low (e.g., about 3 nA).

Figure 5:
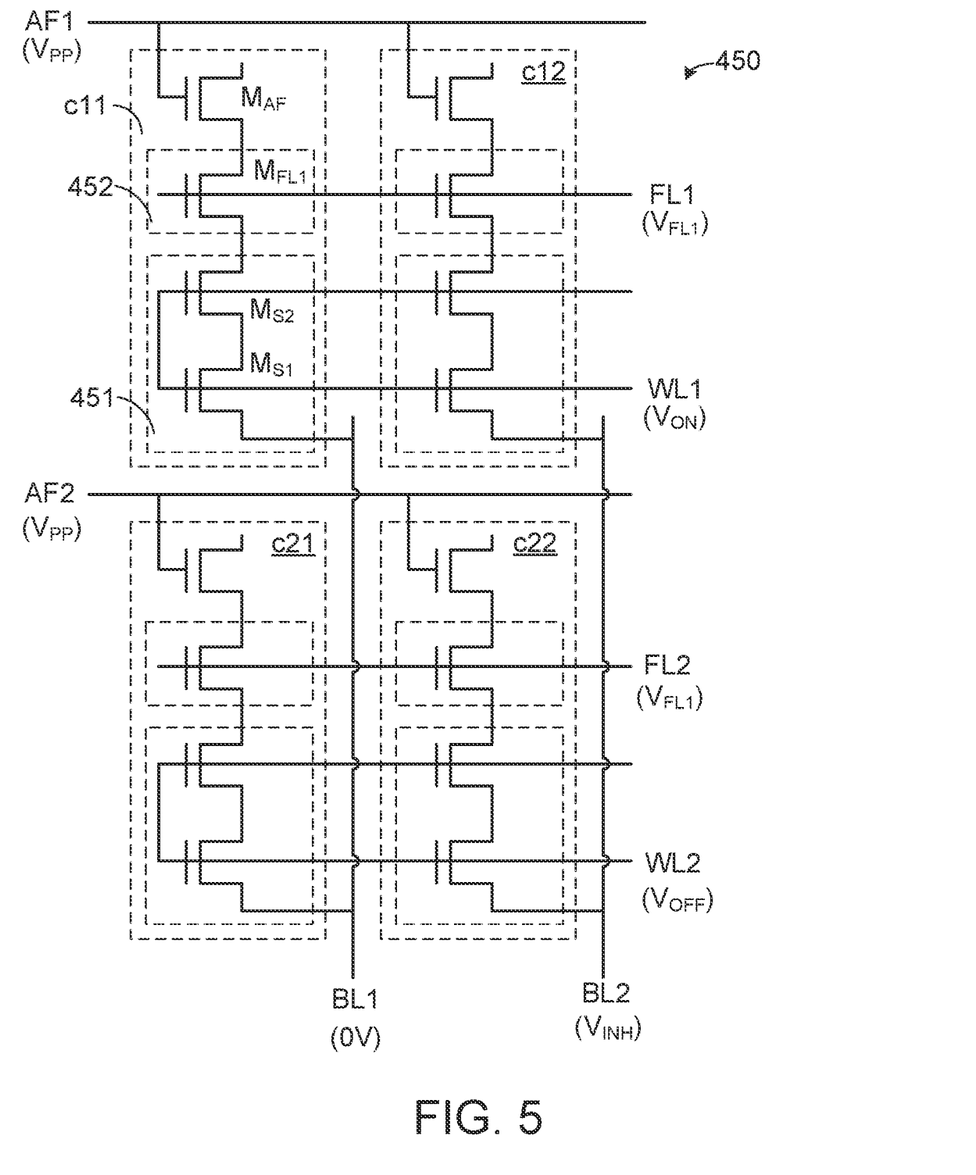
FIG. 5 is a schematic circuit diagram illustrating a cell array structure with plural antifuse-type OTP memory cells of the second embodiment and associated bias voltages.

FIG. 5 is a schematic circuit diagram illustrating a cell array structure with plural antifuse-type OTP memory cells of the second embodiment and associated bias voltages. The cell array structure comprises m×n antifuse-type OTP memory cells, wherein m and n are positive integers. For illustration, the cell array structure 450 of this embodiment comprises 2×2 antifuse-type OTP memory cells c11~c22. Each of the antifuse-type OTP memory cells c11~c22 has the structure as shown in FIG. 4A. For example, the antifuse-type OTP memory cell c11 comprises a select device 451, a following device 452 and an antifuse transistor $M_{AF}$.

Please refer to the cell array structure 450 of FIG. 5. Both of the two antifuse-type OTP memory cells c11~c12 in the first row are connected with a first word line WL1, a first following control line FL1 and a first antifuse control line AF1. Moreover, the two antifuse-type OTP memory cells c11~c12 in the first row are connected with a first bit line BL1 and a second bit line BL2, respectively. Both of the two antifuse-type OTP memory cells c21~c22 in the second row are connected with a second word line WL2, a second following control line FL2 and a second antifuse control line AF2. Moreover, the two antifuse-type OTP memory cells c21~c22 in the second row are connected with a first bit line BL1 and a second bit line BL2, respectively.

Please refer to FIG. 5 again. The antifuse control lines AF1 and AF2 receive a program voltage $V_{PP}$, the following control lines FL1 and FL2 receive a first control voltage $V_{FL1}$, the first bit line BL1 receives a ground voltage (0V), the second bit line BL2 receives an inhibition voltage $V_{INH}$, the first word line WL1 receives an on voltage $V_{ON}$, and the second word line WL2 receives an off voltage $V_{OFF}$. For example, the program voltage $V_{PP}$ is 5V, the first control voltage $V_{FL1}$ is 2V, the on voltage $V_{ON}$ is 1.2V, the off voltage $V_{OFF}$ is 0V, and the inhibition voltage $V_{INH}$ is 1.2V.

Consequently, the first row connected to the first word line WL1 is a selected row, and the second row connected to the second word line WL2 is an unselected row. In addition, the two antifuse-type OTP memory cells c21~c22 in the second row are unselected cells. Moreover, the first bit line BL1 receives the ground voltage (0V), and the second bit line BL2 receives the inhibition voltage $V_{INH}$. Consequently, the antifuse-type OTP memory cell c11 is a selected cell, and the antifuse-type OTP memory cell c12 is an unselected cell. Moreover, in the cell array structure 450, the selected cell c11 undergoes a program action, and the unselected cell c12 undergoes an inhibition action.

Figure 6A:
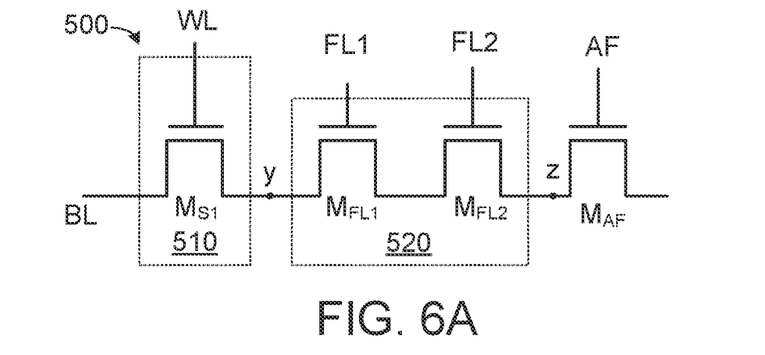
FIG. 6A is a schematic circuit diagram illustrating an antifuse-type OTP memory cell according to a third embodiment of the present invention.

FIG. 6A is a schematic circuit diagram illustrating an antifuse-type OTP memory cell according to a third embodiment of the present invention. As shown in FIG. 6A, the antifuse-type OTP memory cell 500 comprises a select device 510, a following device 520 and an antifuse transistor $M_{AF}$.

The connection relationships between associated components of the antifuse-type OTP memory cell 500 will be described as follows. The first terminal of the select device 510 is connected with a bit line BL. The select terminal of the select device 510 is connected with a word line WL. The second terminal of the select device 510 is connected with the node y. The first terminal of the following device 520 is connected with the node y. The plural control terminals of the following device 520 are connected with corresponding following control lines. For succinctness, only two following control lines FL1 and FL2 are shown. The second terminal of the following device 520 is connected with the node z. The first drain/source terminal of the antifuse transistor $M_{AF}$ is connected with the node z. The gate terminal of the antifuse transistor $M_{AF}$ is connected with an antifuse control line AF. The second drain/source terminal of the antifuse transistor $M_{AF}$ is in a floating state.

In this embodiment, the select device 510 comprises a select transistors $M_{S1}$, and the following device 520 comprises two following transistors $M_{FL1}$ and $M_{FL2}$. The connection relationships between associated components of the select transistor 510 will be described as follows. The first drain/source terminal of the select transistor $M_{S1}$ is connected with the bit line BL. The gate terminal of the select transistor $M_{S1}$ is connected with the word line WL. The second drain/source terminal of the select transistor $M_{S1}$ is connected with the node y. The connection relationships between associated components of the following device 520 will be described as follows. The first drain/source terminal of the following transistor $M_{FL1}$ is connected with the node y. The gate terminal of the following transistor $M_{FL1}$ is connected with the following control line FL1. The second drain/source terminal of the following transistor $M_{FL1}$ is connected with the first drain/source terminal of the following transistor $M_{FL2}$. The gate terminal of the following transistor $M_{FL2}$ is connected with the following control line FL2. The second drain/source terminal of the following transistor $M_{FL2}$ is connected with the node z.

Since the second drain/source terminal of the antifuse transistor $M_{AF}$ is in the floating state, the antifuse transistor $M_{AF}$ can be considered as a capacitor. Moreover, since the antifuse-type OTP memory cell 500 includes three transistors and one capacitor, the antifuse-type OTP memory cell 500 can be referred as a 3T1C cell.

Figure 6B:
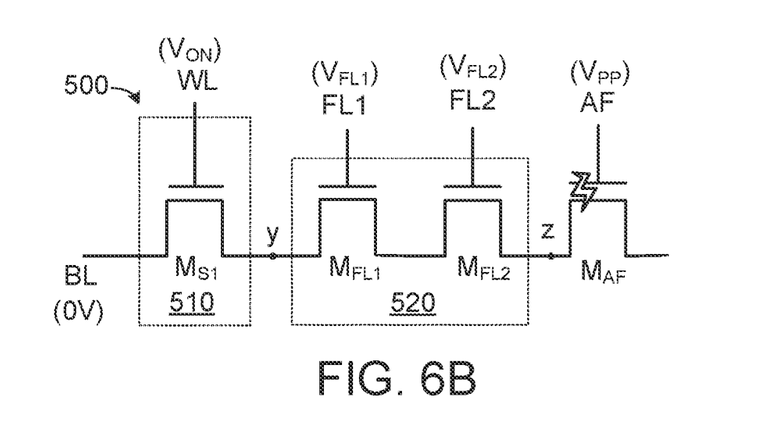
FIG. 6B schematically illustrates associated bias voltages for performing a program action on the antifuse-type OTP memory cell as shown in FIG. 6A.
Figure 6C:
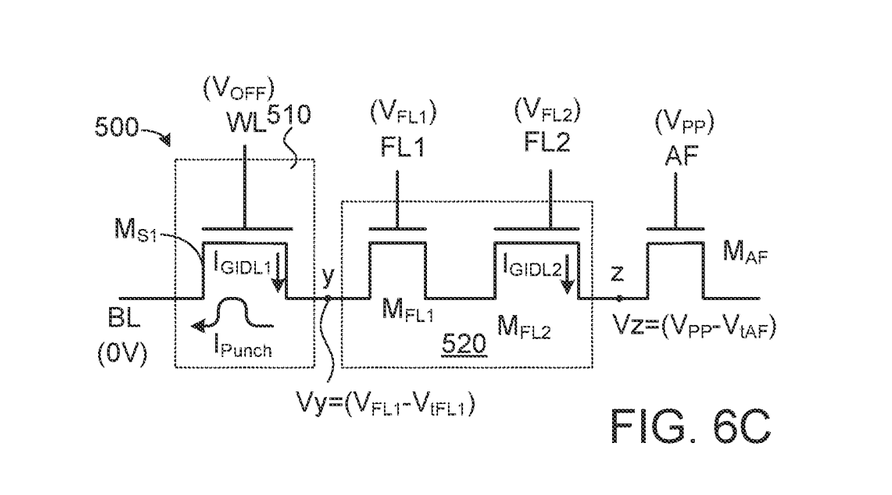
FIG. 6C schematically illustrates associated bias voltages for performing a program inhibition action on the antifuse-type OTP memory cell as shown in FIG. 6A.

FIG. 6B schematically illustrates associated bias voltages for performing a program action on the antifuse-type OTP memory cell as shown in FIG. 6A. FIG. 6C schematically illustrates associated bias voltages for performing a program inhibition action on the antifuse-type OTP memory cell as shown in FIG. 6A.

Please refer to FIG. 6B. When the program action is performed, the bit line BL receives a ground voltage (0V), the antifuse control line AF receives a program voltage $V_{PP}$, the word line WL receives an on voltage $V_{ON}$, the first following control line FL1 receives a first control voltage $V_{FL1}$, and the second following control line FL2 receives a second control voltage $V_{FL2}$. For example, the program voltage $V_{PP}$ is 5V, the on voltage $V_{ON}$ is 1V, the first control voltage $V_{FL1}$ is 1.5V, and the second control voltage $V_{FL2}$ is 2V. In response to the on voltage $V_{ON}$, the select transistors $M_{S1}$ is turned on. That is, in response to the on voltage $V_{ON}$, the select device 510 is turned on. In response to the first control voltage $V_{FL1}$ and the second control voltage $V_{FL2}$, the following transistors $M_{FL1}$ and the $M_{FL2}$ are controlled to be in the conducting state. That is, the following device 520 is in the conducting state. Consequently, the region between the node y and the node z is conducted. In this embodiment, the program voltage $V_{PP}$ is higher than the second control voltage $V_{FL2}$, the second control voltage $V_{FL2}$ is higher than or equal to the first control voltage $V_{FL1}$, and the first control voltage $V_{FL1}$ is higher than the on voltage $V_{ON}$.

When the select device 510 is turned on and the following device 520 is in the conducting state, the ground voltage (0V) of the bit line BL is transferred to the first drain/source terminal of the antifuse transistor $M_{AF}$. Consequently, the voltage stress between the gate terminal and the first drain/source terminal of the antifuse transistor $M_{AF}$ is equal to the program voltage $V_{PP}$. Under this circumstance, a gate oxide layer of the antifuse transistor $M_{AF}$ is ruptured, and the region between the gate terminal and the first drain/source terminal of the antifuse transistor $M_{AF}$ has a low resistance value. That is, the antifuse-type OTP memory cell 500 is in a low-resistance storage state.

Please refer to FIG. 6C. When the program inhibition action is performed, the bit line BL receives the ground voltage (0V), the antifuse control line AF receives the program voltage $V_{PP}$, the word line WL receives the off voltage $V_{OFF}$, the first following control line FL1 receives the first control voltage $V_{FL1}$, and the second following control line FL2 receives the second control voltage $V_{FL2}$. For example, the program voltage $V_{PP}$ is 5V, the off voltage $V_{OFF}$ is 0V, the first control voltage $V_{FL1}$ is 1.5V, and the second control voltage $V_{FL2}$ is 2V. In response to the off voltage $V_{OFF}$, the two select transistors MS1 and MS2 are turned off. That is, in response to the off voltage $V_{OFF}$, the select device 510 is turned off.

When the select device 510 is turned off and the following device 520 is in the conducting state, the ground voltage (0V) of the bit line BL cannot be transferred to the first drain/source terminal of the antifuse transistor $M_{AF}$. Consequently, the voltage stress between the gate terminal and the first drain/source terminal of the antifuse transistor $M_{AF}$ is very low. Under this circumstance, the gate oxide layer of the antifuse transistor $M_{AF}$ is not ruptured, and the region between the gate terminal and the first drain/source terminal of the antifuse transistor $M_{AF}$ is maintained at a high resistance value. That is, the antifuse-type OTP memory cell 500 is in a high-resistance storage state.

Please refer to FIG. 6C again. When the program inhibition action is performed, the select device 510 is turned off. Meanwhile, the voltage at the node y is expressed as: $Vy=(V_{FL1}-V_{tFL1})$, and the select device 510 generates a leakage current. For example, the leakage current includes a punch current $I_{Punch}$ and a gate induced drain leakage (GIDL) current $I_{GIDL1}$. In addition, the voltage at the node z is expressed as: $Vz=(V_{PP}-V_{tAF})$, and the following transistor $M_{FL2}$ of the following device 520 generates a leakage current, e.g., a gate induced drain leakage (GIDL) current $I_{GIDL2}$. For example, $V_{tFL1}$ is a threshold voltage of the following transistor $M_{FL1}$ (e.g., about 0.7V), and $V_{tAF}$ is a threshold voltage of the antifuse transistor $M_{AF}$ (e.g., about 1V).

As mentioned above, by adjusting the first control voltage $V_{FL1}$, the voltage Vy at the node y can be further adjusted. Consequently, the punch current $I_{Punch}$ and the gate induced drain leakage current $I_{GIDL1}$ are further adjusted. For example, in case that the first control voltage $V_{FL1}$ is 1.5V, the voltage Vy at the node y is about 0.8V (i.e., 1.5V–0.7V=0.8V). Under this circumstance, the select device 510 hardly generates the punch current $I_{Punch}$, and the gate induced drain leakage current $I_{GIDL1}$ is very low (e.g., about 1 nA).

Similarly, by adjusting the magnitude of the second control voltage $V_{FL2}$, the voltage difference between the second drain/source terminal of the following transistor $M_{FL2}$ (i.e., the node z) and the gate terminal of the following transistor $M_{FL2}$ can be further adjusted. Consequently, the gate induced drain leakage current $I_{GIDL2}$ is further adjusted. For example, in case that the second control voltage $V_{FL2}$ is 2V, the voltage Vz at the node z is about 4V (i.e., 5V–1V=4V), and the voltage difference between the second drain/source terminal of the following transistor $M_{FL2}$ and the gate terminal of the following transistor $M_{FL2}$ is about 2V (i.e., 4V–2V=2V). Under this circumstance, the gate induced drain leakage current $I_{GIDL2}$ is very low (e.g., about 3 nA).

Figure 7:
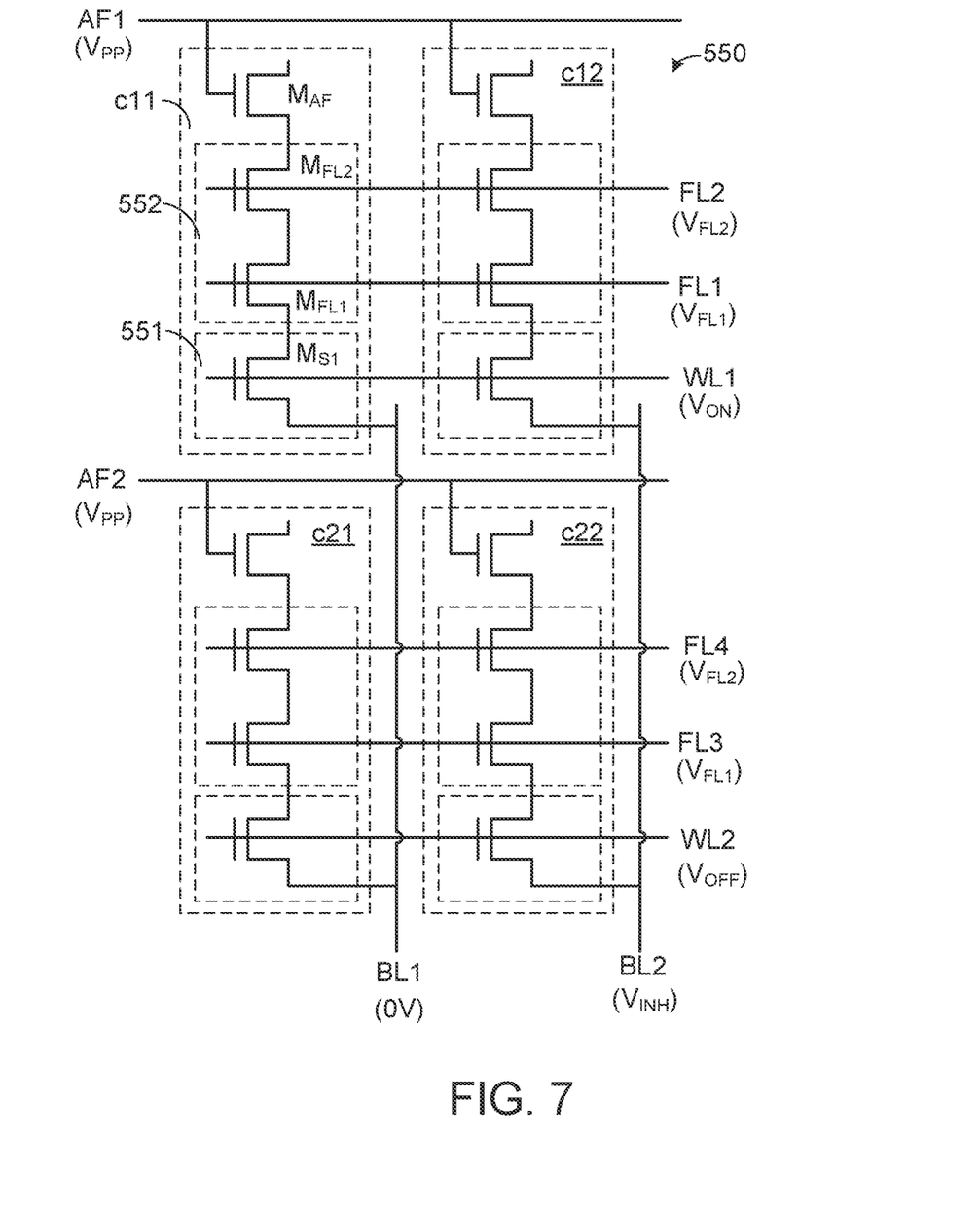
FIG. 7 is a schematic circuit diagram illustrating a cell array structure with plural antifuse-type OTP memory cells of the third embodiment and associated bias voltages.

FIG. 7 is a schematic circuit diagram illustrating a cell array structure with plural antifuse-type OTP memory cells of the third embodiment and associated bias voltages. The cell array structure comprises m×n antifuse-type OTP memory cells, wherein m and n are positive integers. For illustration, the cell array structure 550 of this embodiment comprises 2×2 antifuse-type OTP memory cells c11~c22. Each of the antifuse-type OTP memory cells c11~c22 has the structure as shown in FIG. 6A. For example, the antifuse-type OTP memory cell c11 comprises a select device 551, a following device 552 and an antifuse transistor $M_{AF}$.

Please refer to the cell array structure 550 of FIG. 7. Both of the two antifuse-type OTP memory cells c11~c12 in the first row are connected with a first word line WL1, a first following control line FL1, a second following control line FL2 and a first antifuse control line AF1. Moreover, the two antifuse-type OTP memory cells c11~c12 in the first row are connected with a first bit line BL1 and a second bit line BL2, respectively. Both of the two antifuse-type OTP memory cells c21~c22 in the second row are connected with a second word line WL2, a third following control line FL3, a fourth following control line FL4 and a second antifuse control line AF2. Moreover, the two antifuse-type OTP memory cells c21~c22 in the second row are connected with a first bit line BL1 and a second bit line BL2, respectively.

Please refer to FIG. 7 again. The antifuse control lines AF1 and AF2 receive a program voltage $V_{PP}$, the following control lines FL1 and FL3 receive a first control voltage $V_{FL1}$, the following control lines FL2 and FL4 receive a second control voltage $V_{FL2}$, the first bit line BL1 receives a ground voltage (0V), the second bit line BL2 receives an inhibition voltage $V_{INH}$, the first word line WL1 receives an on voltage $V_{ON}$, and the second word line WL2 receives an off voltage $V_{OFF}$. For example, the program voltage $V_{PP}$ is 5V, the first control voltage $V_{FL1}$ is 1.5V, the second control voltage $V_{FL2}$ is 2V, the on voltage $V_{ON}$ is 1V, the off voltage $V_{OFF}$ is 0V, and the inhibition voltage $V_{INH}$ is 1.2V.

Consequently, the first row connected to the first word line WL1 is a selected row, and the second row connected to the second word line WL2 is an unselected row. In addition, the two antifuse-type OTP memory cells c21~c22 in the second row are unselected cells. Moreover, the first bit line BL1 receives the ground voltage (0V), and the second bit line BL2 receives the inhibition voltage $V_{INH}$. Consequently, the antifuse-type OTP memory cell c11 is a selected cell, and the antifuse-type OTP memory cell c12 is an unselected cell. Moreover, the selected cell c11 in the cell array structure 550 undergoes a program action, and the unselected cell c12 undergoes an inhibition action.

Similarly, plural antifuse-type OTP memory cells of the first embodiment can be combined as a cell array structure. By providing proper bias voltages to the cell array structure, a program action and a program inhibition action can be selectively performed on the memory cells of the cell array structure. It is noted the bias voltages for performing the program action or the program inhibition action on the antifuse-type OTP memory cell of the present invention are not restricted. That is, the bias voltages for performing the program action or the program inhibition action on the antifuse-type OTP memory cell may be varied according to the practical requirements.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A cell array structure comprising a first antifuse-type one time programming memory cell, the first antifuse-type one time programming memory cell comprising:

a first select device, wherein a first terminal of the first select device is connected with a first bit line, a second terminal of the first select device is connected with a first node, and a select terminal of the first select device is connected with a first word line;

a first following device, wherein a first terminal of the first following device is connected with the first node, a second terminal of the first following device is connected with a second node, and a first control terminal of the first following device is connected with a first following control line; and a first antifuse transistor, wherein a first drain/source terminal of the first antifuse transistor is connected with the second node, a gate terminal of the first antifuse transistor is connected with a first antifuse control line, and a second drain/source terminal of the first antifuse transistor is in a floating state, wherein the first select device comprises a first select transistor and a second select transistor, wherein a first drain/source terminal of the first select transistor is connected with the first bit line, a gate terminal of the first select transistor is connected with the first word line, a second drain/source terminal of the first select transistor is connected with a first drain/source terminal of the second select transistor, a gate terminal of the second select transistor is connected with the first word line, and a second drain/source terminal of the second select transistor is connected with the first node.

2. The array structure as claimed in claim 1, further comprising a second antifuse-type one time programming memory cell, wherein the second antifuse-type one time programming memory cell comprises:

a second select device, wherein a first terminal of the second select device is connected with a second bit line, a second terminal of the second select device is connected with a third node, and a select terminal of the second select device is connected with the first word line;

a second following device, wherein a first terminal of the second following device is connected with the third node, a second terminal of the second following device is connected with a fourth node, and a first control terminal of the second following device is connected with the first following control line; and a second antifuse transistor, wherein a first drain/source terminal of the second antifuse transistor is connected with the fourth node, a gate terminal of the second antifuse transistor is connected with the first antifuse control line, and a second drain/source terminal of the second antifuse transistor is in the floating state.

3. The array structure as claimed in claim 2, further comprising a third antifuse-type one time programming memory cell, wherein the third antifuse-type one time programming memory cell comprises:

a third select device, wherein a first terminal of the third select device is connected with the first bit line, a second terminal of the third select device is connected with a fifth node, and a select terminal of the third select device is connected with a second word line;

a third following device, wherein a first terminal of the third following device is connected with the fifth node, a second terminal of the third following device is connected with a sixth node, and a first control terminal of the third following device is connected with a second following control line; and a third antifuse transistor, wherein a first drain/source terminal of the third antifuse transistor is connected with the sixth node, a gate terminal of the third antifuse transistor is connected with a second antifuse control line, and a second drain/source terminal of the third antifuse transistor is in the floating state.

4. The cell array structure as claimed in claim 1, wherein the first following device comprises a first following transistor, wherein a first drain/source terminal of the first following transistor is connected with the first node, a gate terminal of the first following transistor is connected with the first following control line, and a second drain/source terminal of the first following transistor is connected with the second node.

5. The cell array structure as claimed in claim 1, wherein when a program action is performed, the first bit line receives a ground voltage, the first word line receives an on voltage, the first following control line receives a first control voltage, and the first antifuse control line receives a program voltage, wherein when the program action is performed, the first select device is turned on, the first following device is in a conducting state, and a gate oxide layer of the first antifuse transistor is ruptured, so that the first antifuse-type one time programming memory cell is in a low-resistance storage state.

6. The cell array structure as claimed in claim 5, wherein the program voltage is higher than the first control voltage, and the first control voltage is higher than the on voltage.

7. The cell array structure as claimed in claim 1, wherein when a program inhibition action is performed, the first bit line receives a ground voltage, the first word line receives an off voltage, the first following control line receives a first control voltage, and the first antifuse control line receives a program voltage, wherein when the program inhibition action is performed, the first select device is turned off, the first following device is in a conducting state, and a gate oxide layer of the first antifuse transistor is not ruptured, so that the first antifuse-type one time programming memory cell is in a high-resistance storage state.

8. The cell array structure as claimed in claim 1, wherein the first following device comprises a first following transistor and a second following transistor, wherein a first drain/source terminal of the first following transistor is connected with the first node, a gate terminal of the first following transistor is connected with the first following control line, a second drain/source terminal of the first following transistor is connected with a first drain/source terminal of the second following transistor, a gate terminal of the second following transistor is connected with a second following control line, and a second drain/source terminal of the second following transistor is connected with the second node.

9. The cell array structure as claimed in claim 8, wherein when a program action is performed, the first bit line receives a ground voltage, the first word line receives an on voltage, the first following control line receives a first control voltage, the second following control line receives a second control voltage, and the first antifuse control line receives a program voltage, wherein when the program action is performed, the first select device is turned on, the first following transistor is in a conducting state, and a gate oxide layer of the first antifuse transistor is ruptured, so that the first antifuse-type one time programming memory cell is in a low-resistance storage state.

10. The cell array structure as claimed in claim 9, wherein the program voltage is higher than the second control voltage, the second control voltage is higher than or equal to the first control voltage, and the first control voltage is higher than the on voltage.

11. The cell array structure as claimed in claim 8, wherein when a program inhibition action is performed, the first bit line receives a ground voltage, the first word line receives an off voltage, the first following control line receives a first control voltage, the second following control line receives a second control voltage, and the first antifuse control line receives a program voltage, wherein when the program inhibition action is performed, the first select device is turned off, the first following device is in a conducting state, and a gate oxide layer of the first antifuse transistor is not ruptured, so that the first antifuse-type one time programming memory cell is in a high-resistance storage state.

12. A cell array structure comprising a first antifuse-type one time programming memory cell, the first antifuse-type one time programming memory cell comprising:
   a first select device, wherein a first terminal of the first select device is connected with a first bit line, a second terminal of the first select device is connected with a first node, and a select terminal of the first select device is connected with a first word line;
   a first following device, wherein a first terminal of the first following device is connected with the first node, a second terminal of the first following device is connected with a second node, a first control terminal of the first following device is connected with a first following control line, and a second control terminal of the first following device is connected with a second following control line; and
   a first antifuse transistor, wherein a first drain/source terminal of the first antifuse transistor is connected with the second node, a gate terminal of the first antifuse transistor is connected with a first antifuse control line, and a second drain/source terminal of the first antifuse transistor is in a floating state,
   wherein the first following device comprises a first following transistor and a second following transistor, wherein a first drain/source terminal of the first following transistor is connected with the first node, a gate terminal of the first following transistor is connected with the first following control line, a second drain/source terminal of the first following transistor is connected with a first drain/source terminal of the second following transistor, a gate terminal of the second following transistor is connected with the second following control line, and a second drain/source terminal of the second following transistor is connected with the second node.

13. The array structure as claimed in claim 12, further comprising a second antifuse-type one time programming memory cell, wherein the second antifuse-type one time programming memory cell comprises:
   a second select device, wherein a first terminal of the second select device is connected with a second bit line, a second terminal of the second select device is connected with a third node, and a select terminal of the second select device is connected with the first word line;
   a second following device, wherein a first terminal of the second following device is connected with the third node, a second terminal of the second following device is connected with a fourth node, a first control terminal of the second following device is connected with the first following control line, and a second control terminal of the second following device is connected with the second following control line; and
   a second antifuse transistor, wherein a first drain/source terminal of the second antifuse transistor is connected with the fourth node, a gate terminal of the second antifuse transistor is connected with the first antifuse control line, and a second drain/source terminal of the second antifuse transistor is in the floating state.

14. The array structure as claimed in claim 13, further comprising a third antifuse-type one time programming memory cell, wherein the third antifuse-type one time programming memory cell comprises:
   a third select device, wherein a first terminal of the third select device is connected with the first bit line, a second terminal of the third select device is connected with a fifth node, and a select terminal of the third select device is connected with a second word line;
   a third following device, wherein a first terminal of the third following device is connected with the fifth node, a second terminal of the third following device is connected with a sixth node, a first control terminal of the third following device is connected with a third following control line, and a second control terminal of the third following device is connected with a fourth following control line; and
   a third antifuse transistor, wherein a first drain/source terminal of the third antifuse transistor is connected with the sixth node, a gate terminal of the third antifuse transistor is connected with a second antifuse control line, and a second drain/source terminal of the third antifuse transistor is in the floating state.

15. The cell array structure as claimed in claim 12, wherein the first select device comprises a first select transistor, wherein a first drain/source terminal of the first select transistor is connected with the first bit line, a gate terminal of the first select transistor is connected with the first word line, and a second drain/source terminal of the first select transistor is connected with the first node.

16. The cell array structure as claimed in claim 12, wherein when a program action is performed, the first bit line receives a ground voltage, the first word line receives an on voltage, the first following control line receives a first control voltage, the second following control line receives a second control voltage, and the first antifuse control line receives a program voltage, wherein when the program action is performed, the first select device is turned on, the first following device is in a conducting state, and a gate oxide layer of the first antifuse transistor is ruptured, so that the first antifuse-type one time programming memory cell is in a low-resistance storage state.

17. The cell array structure as claimed in claim 16, wherein the program voltage is higher than the second control voltage, the second control voltage is higher than or equal to the first control voltage, and the first control voltage is higher than the on voltage.

18. The cell array structure as claimed in claim 12, wherein when a program inhibition action is performed, the first bit line receives a ground voltage, the first word line receives an off voltage, the first following control line receives a first control voltage, the second following control line receives a second control voltage, and the first antifuse control line receives a program voltage, wherein when the program inhibition action is performed, the first select device is turned off, the first following device is in a conducting state, and a gate oxide layer of the first antifuse transistor is not ruptured, so that the first antifuse-type one time programming memory cell is in a high-resistance storage state.

* * * * *